(12) United States Patent
Kawasaki

(10) Patent No.: US 11,700,774 B2
(45) Date of Patent: Jul. 11, 2023

(54) CIRCUIT MODULE

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 283 days.

(21) Appl. No.: 17/087,655

(22) Filed: Nov. 3, 2020

(65) Prior Publication Data

US 2021/0050382 A1     Feb. 18, 2021

Related U.S. Application Data

(63) Continuation of application No. 15/492,037, filed on Apr. 20, 2017, now Pat. No. 10,861,900.

(30) Foreign Application Priority Data

Apr. 25, 2016   (JP) ................. 2016-087284

(51) Int. Cl.
| | |
|---|---|
| *H01L 27/20* | (2006.01) |
| *H10N 39/00* | (2023.01) |
| *H03H 9/10* | (2006.01) |
| *H03H 9/05* | (2006.01) |
| *H10N 30/87* | (2023.01) |

(Continued)

(52) U.S. Cl.
CPC ............ *H10N 39/00* (2023.02); *H01L 24/16* (2013.01); *H01L 28/10* (2013.01); *H03H 9/058* (2013.01); *H03H 9/059* (2013.01); *H03H 9/0542* (2013.01); *H03H 9/1071* (2013.01); *H03H 9/145* (2013.01); *H10N 30/87* (2023.02); *H10N 30/88* (2023.02); *H01L 2924/19042* (2013.01)

(58) Field of Classification Search
CPC ............... H01L 41/047; H01L 41/053; H03H 9/0542; H03H 9/058; H03H 9/059; H03H 9/1071; H03H 9/145
See application file for complete search history.

(56) References Cited

U.S. PATENT DOCUMENTS

| | | | |
|---|---|---|---|
| 2010/0237962 A1* | 9/2010 | Schmidhammer ... | H03H 9/0542 333/187 |
| 2013/0020913 A1* | 1/2013 | Shirakawa ............. | H01G 4/224 336/200 |
| 2016/0212850 A1* | 7/2016 | Kainuma ............. | H10N 30/877 |

OTHER PUBLICATIONS

English Translation of JP 2008167358 (Year: 2008).*
Kawasaki, "Circuit Module", U.S. Appl. No. 15/492,037, filed Apr. 20, 2017.

* cited by examiner

Primary Examiner — Bryan P Gordon
(74) Attorney, Agent, or Firm — Keating & Bennett, LLP

(57) ABSTRACT

A circuit module includes a mounting substrate including a conductor wiring, an elastic wave element provided in or on a main surface of the mounting substrate, an electric element provided in or on the main surface, the electric element being different from the elastic wave element, and an insulating resin portion provided in or on the main surface to cover the elastic wave element and the electric element. The elastic wave element and the electric element are connected to each other by the conductor wiring. A height of the elastic wave element is about 0.28 mm or less, which is less than that of the electric element. The thickness of the resin portion in a region in which the resin portion covers the elastic wave element is greater than the thickness of the resin portion in a region in which the resin portion covers the electric element.

26 Claims, 2 Drawing Sheets

(51) Int. Cl.
*H10N 30/88* (2023.01)
*H01L 23/00* (2006.01)
*H01L 49/02* (2006.01)
*H03H 9/145* (2006.01)

CIRCUIT MODULE

CROSS REFERENCE TO RELATED APPLICATIONS

This application claims the benefit of priority to Japanese Patent Application No. 2016-087284 filed on Apr. 25, 2016. The entire contents of this application are hereby incorporated herein by reference.

BACKGROUND OF THE INVENTION

1. Field of the Invention

The present invention relates to a circuit module that includes an elastic wave element.

2. Description of the Related Art

In the related art, there is known a circuit module that includes a plurality of mounting components.

As an example of this type of circuit module, Japanese Unexamined Patent Application Publication No. 2011-222704 discloses a circuit module that includes a mounting substrate, a plurality of mounting components, which are mounted in or on the mounting substrate, and a resin portion, which is mounted on the mounting substrate to cover these mounting components.

With the reduction in the size and the improvement in integration of mobile communication terminals, it is desirable to reduce circuit modules in size. Consequently, for example, the thickness of a resin portion in a region in which the resin portion covers a mounting component is reduced such that the height of a circuit module is reduced.

However, in the case where a product number is marked on a circuit module by, for example, performing laser marking on the top surface of the circuit module, there is a problem in that, when the thickness of a resin portion in a region in which the resin portion covers a mounting component is small, the laser beam reaches the mounting component by passing through the resin portion and damages the mounting component. In particular, in the case where the mounting component is an elastic wave element, the degree of damage sustained by the elastic wave element is large.

SUMMARY OF THE INVENTION

Preferred embodiments of the present invention provide a reduction in the height of a circuit module that includes an elastic wave element. Accordingly, damage sustained by the elastic wave element is able to be significantly reduced or prevented.

A circuit module according to a preferred embodiment of the present invention includes a mounting substrate including a conductor wiring, an elastic wave element provided in or on a main surface of the mounting substrate, an electric element provided in or on the main surface of the mounting substrate, the electric element being different from the elastic wave element, and a resin portion provided in or on the main surface of the mounting substrate to cover the elastic wave element and the electric element. The resin portion is an insulator. The elastic wave element and the electric element are connected to each other by the conductor wiring. The elastic wave element preferably has a height of not more than about 0.28 mm, for example, which is less than a height of the electric element. A thickness of the resin portion in a region in which the resin portion covers the elastic wave element is greater than a thickness of the resin portion in a region in which the resin portion covers the electric element.

By reducing the height of the elastic wave element by setting the height of the elastic wave element to about 0.28 mm or less, for example, a reduction in the height of the circuit module is able to be achieved. In addition, by increasing the thickness of the resin portion in the region in which the resin portion covers the elastic wave element, damage sustained by the elastic wave element, for example, during laser marking on a top surface of the circuit module is able to be significantly reduced or prevented.

By reducing the thickness of the resin portion in the region in which the resin portion covers the electric element, heat generated within the circuit module is able to be efficiently dissipated through the portion of the resin portion including a small thickness, that is, the resin portion in the region in which the resin portion covers the electric element. For example, when a voltage is applied to the elastic wave element, heat is generated due to vibration of the elastic wave element, and according to the above-described structure, the generated heat is able to be transferred to the electric element through the conductor wiring and is able to be dissipated from the electric element through the portion of the resin portion including a small thickness. Accordingly, an increase in the temperature of the elastic wave element is able to be significantly reduced or prevented, and the electric power handling capability of the circuit module is able to be significantly improved.

The thickness of the resin portion in the region in which the resin portion covers the electric element may be about 0.14 mm or less, for example.

In this case, since the thickness of the resin portion in the region in which the resin portion covers the electric element preferably is about 0.14 mm or less, for example, heat generated within the circuit module is able to be efficiently dissipated through the portion of the resin portion including a small thickness. Accordingly, the electric power handling capability of the circuit module is able to be significantly improved.

The elastic wave element may include a piezoelectric substrate with a thickness of not more than about 0.11 mm, for example, and an interdigital transducer (IDT) electrode provided in or on a main surface of the piezoelectric substrate, and the elastic wave element may be connected to the conductor wiring of the mounting substrate with a solder bump interposed between the conductor wiring of the mounting substrate and the elastic wave element, for example. The main surface of the piezoelectric substrate and the main surface of the mounting substrate preferably face each other, for example.

By setting the thickness of the piezoelectric substrate to about 0.11 mm or less, for example, the height of the elastic wave element is reduced, so that the height of the circuit module is able to be reduced. Even in the case where a heat transfer path of the piezoelectric substrate becomes narrower due to setting the thickness of the piezoelectric substrate to about 0.11 mm or less, for example, heat is able to be transferred to the electric element from the elastic wave element through the conductor wiring and is able to be dissipated from the electric element through the portion of the resin portion including a small thickness. Accordingly, an increase in the temperature of the elastic wave element is able to be significantly reduced or prevented, and the electric power handling capability of the circuit module is able to be significantly improved.

The elastic wave element may further include a support layer vertically or substantially vertically surrounding a periphery of a region of the main surface of the piezoelectric substrate in which the IDT electrode is provided and a cover layer disposed on the support layer, the cover layer covering the IDT electrode with a space interposed between the IDT electrode and the cover layer.

In this case, a reduction in the height of the elastic wave element, which includes the piezoelectric substrate, the IDT electrode provided in or on the piezoelectric substrate, the support layer provided on the piezoelectric substrate, and the cover layer, is able to be provided, and damage sustained by the elastic wave element is able to be significantly reduced or prevented.

The electric element may include a material that is less likely to absorb a laser beam.

In this case, damage sustained by the electric element during laser marking on the top surface of the circuit module is able to be significantly reduced or prevented, and thus, the thickness of the resin portion in the region in which the resin portion covers the electric element is able to be reduced. Accordingly, the height of the circuit module is able to be reduced, and heat generated within the circuit module is able to be efficiently dissipated through the portion of the resin portion including a small thickness.

The electric element may be a chip ceramic electronic component.

Since damage to the ceramic electronic component, which is the electric element, from a laser beam is able to be significantly reduced or prevented, the thickness of the resin portion in the region in which the resin portion covers the electric element is able to be reduced, even if laser marking is performed on the top surface of the circuit module. Accordingly, the height of the circuit module is able to be reduced, and heat generated within the circuit module is able to be efficiently dissipated through the portion of the resin portion including a small thickness.

The elastic wave element and the electric element may be arranged adjacent to or in a vicinity of one another.

In this case, the length of a heat transfer path extending from the elastic wave element to the electric element is able to be reduced. Therefore, the speed at which heat is transferred from the elastic wave element to the electric element is able to be increased, and the heat is able to be efficiently dissipated. Accordingly, an increase in the temperature of the elastic wave element is able to be significantly reduced or prevented, and the electric power handling capability of the circuit module is able to be significantly improved.

The resin portion may include a resin material, which is a main component, and a filler dispersed throughout the resin material, and the filler may have a thermal conductivity higher than a thermal conductivity of the resin material.

In this case, the amount of heat to be transferred through the resin portion is able to be increased, and the heat is able to be efficiently dissipated. Accordingly, the electric power handling capability of the circuit module is able to be significantly improved.

The circuit module may further include a shield portion that is electrically conductive and that is provided to cover an outer side of the resin portion.

In this case, heat transferred to the resin portion is dissipated through the shield portion, and thus, the amount of heat to be released is able to be increased. Accordingly, the electric power handling capability of the circuit module is able to be significantly improved.

The thickness of the resin portion in the region in which the resin portion covers the elastic wave element may be not less than about 0.08 mm and not more than about 0.8 mm, for example.

By increasing the thickness of the resin portion in the region in which the resin portion covers the elastic wave element to be not less than about 0.08 mm and not more than about 0.8 mm, for example, damage sustained by the elastic wave element during laser marking on the top surface of the circuit module is able to be significantly reduced or prevented.

According to various preferred embodiments of the present invention, a reduction in the height of a circuit module that includes an elastic wave element is able to be provided, and damage sustained by the elastic wave element is able to be significantly reduced or prevented.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

A circuit module according to a preferred embodiment of the present invention includes an elastic wave element. Preferably, for example, the elastic wave element is a surface acoustic wave element or a boundary acoustic wave element. For example, the circuit module may be included in a duplexer, a multiplexer, or a communication module that is built into a mobile communication terminal or the like.

Before describing the circuit module according to the present preferred embodiment, a problem concerning a circuit module of the related art will be described.

Figure 1:
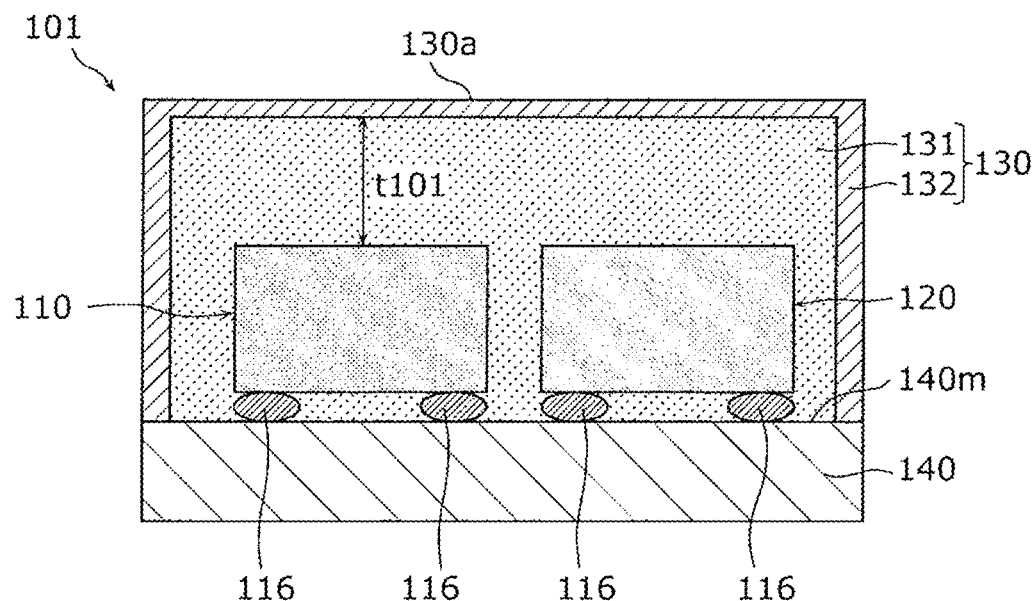
FIG. 1 is a schematic cross-sectional view of a circuit module according to a comparative example.

FIG. 1 is a cross-sectional view of a circuit module 101 according to a comparative example.

The circuit module 101 according to the comparative example includes a mounting substrate 140, an elastic wave element 110, a mounting component 120, and a sealing member 130. The elastic wave element 110 and the mounting component 120 are provided in or on a main surface 140m of the mounting substrate 140. The sealing member 130 covers the elastic wave element 110 and the mounting component 120. The elastic wave element 110 and the mounting component 120 are arranged adjacent to or in a vicinity of one another and mounted in or on the mounting substrate 140 with solder bumps 116 interposed therebetween.

The sealing member 130 includes a resin portion 131, which is an insulator, and a shield portion 132 located outside of the resin portion 131. The resin portion 131 is injected into a region between the elastic wave element 110 and the mounting component 120. Accordingly, the region is filled with the resin portion 131, and the resin portion 131 is also provided in or on the main surface 140m of the mounting substrate 140 to cover the elastic wave element 110 and the mounting component 120.

With the reduction in the size and the increasing integration of mobile communication terminals, it is desirable that the circuit module 101 be reduced in size. Thus, for example, a thickness t101 of the resin portion 131 in a region in which the resin portion 131 covers the elastic wave element 110 is reduced. Preferably, for example, the height of the circuit module 101 is reduced. However, in the case where a product number is marked on the circuit module 101 by, for example, performing laser marking on a top surface 130a of the circuit module 101, there is a problem of the laser beam reaching the elastic wave element 110 by passing through the resin portion 131 and damaging the elastic wave element 110 when the thickness t101 of the resin portion 131 is small.

On the other hand, in the case where the thickness t101 of the resin portion 131 is too large, there is a problem of dissipating heat generated by vibration of the elastic wave element 110 when a voltage is applied to the elastic wave element 110. As the temperature of the elastic wave element 110 increases, the electric power handling capability of the circuit module 101 deteriorates.

The circuit module according to the present preferred embodiment of the present invention includes a structure with which a reduction in the height of the circuit module is able to be provided while damage sustained by the elastic wave element is able to be significantly reduced or prevented and with which heat generated by vibration of the elastic wave element is able to be dissipated.

The circuit module according to the present preferred embodiment of the present invention will be described in detail below with reference to the drawings. Note that the present preferred embodiment, which will be described below, is one preferred specific example of the present invention. Numerical values, shapes, materials, components, arrangement positions and connection configurations of the components, steps, the order of the steps, and the like that are described in the following preferred embodiments are examples and are not intended to limit the scope of the present invention. Among the components described in the following preferred embodiments, the components that are not described in the independent claim representing the most generic concept of the present invention will be described as arbitrary components included in more preferred embodiments.

Figure 2:
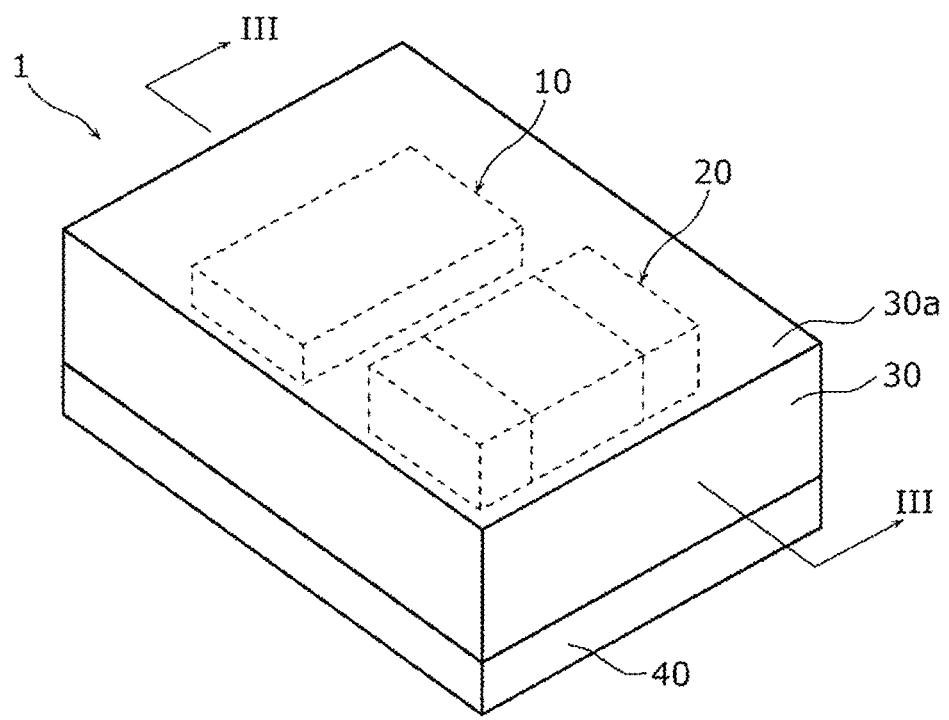
FIG. 2 is a perspective view of a circuit module according to a preferred embodiment of the present invention.
Figure 3:
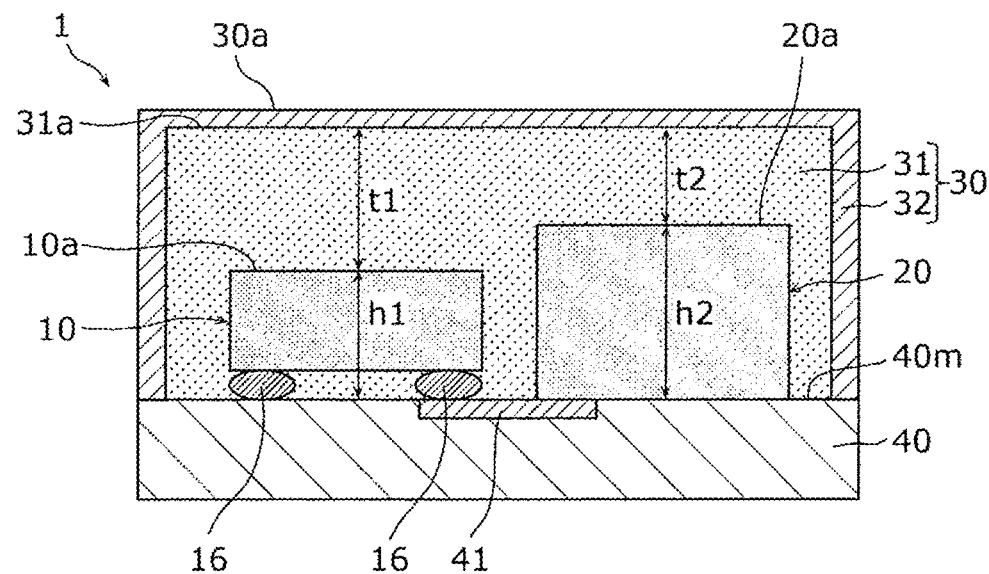
FIG. 3 is a cross-sectional view of the circuit module shown in FIG. 2, taken along line III-III of FIG. 2.

FIG. 2 is a perspective view of a circuit module 1 according to the present preferred embodiment. FIG. 3 is a cross-sectional view of the circuit module 1 taken along line III-III of FIG. 2.

The circuit module 1 according to the present preferred embodiment includes a mounting substrate 40, an elastic wave element 10, an electric element 20, and a sealing member 30. The elastic wave element 10 and the electric element are provided in or on a main surface 40m of the mounting substrate 40. The sealing member 30 covers the elastic wave element 10 and the electric element 20. The elastic wave element 10 and the electric element 20 are arranged adjacent to or in a vicinity of one another. However, although one elastic wave element 10 and one electric element 20 are provided in FIG. 2 and FIG. 3, preferred embodiments of the present invention are not limited to this configuration, and a plurality of elastic wave elements 10 and a plurality of electric elements 20 may be provided on the mounting substrate 40.

A ceramic substrate, a glass epoxy substrate, or the like is included as the mounting substrate 40. A conductor wiring 41 that is defined by a metal foil, for example, a copper (Cu) foil, is formed in or on the main surface 40m of the mounting substrate 40. The elastic wave element 10 and the electric element 20 are electrically and thermally connected to each other by the conductor wiring 41 and solder bumps 16. Preferably, for example, a thermal conductivity of each of the conductor wiring 41 and the solder bumps 16 is higher than a thermal conductivity of the mounting substrate 40, a thermal conductivity of the sealing member 30, and a thermal conductivity of a piezoelectric substrate 11, as described below.

The elastic wave element 10 is a wafer level package (WLP)-type surface acoustic wave device. The elastic wave element 10 includes a rectangular parallelepiped or substantially rectangular parallelepiped shape and is mounted in or on the main surface 40m of the mounting substrate 40 with the solder bumps 16 interposed therebetween. A height h1 of the elastic wave element 10, which is the distance from the main surface 40m of the mounting substrate 40 to the top surface 10a of the elastic wave element 10, in a state where the elastic wave element 10 is mounted in or on the mounting substrate 40 preferably is about 0.28 mm or less, for example.

In the present preferred embodiment, the height of a top surface 30a of the circuit module 1 is reduced by setting the height h1 of the elastic wave element 10 to be less than a height h2 of the electric element 20. Accordingly, the height of the circuit module 1 is able to be reduced. Preferably, for example, the height h1 of the elastic wave element 10 is selected from values within a range of about 0.1 mm or more to about 0.28 mm or less, for example. A configuration of the elastic wave element 10 is described below.

The electric element 20 is an element different from an elastic wave element. Preferably, for example, the electric element 20 is a chip ceramic electronic component, and more preferably, the electric element 20 is a multilayer inductor used that performs impedance matching on the elastic wave element 10.

For example, the electric element 20 is fabricated as described below. First, a multilayer body including a rectangular parallelepiped or substantially rectangular parallelepiped shape is formed preferably by stacking a plurality of ceramic base members, each including a conductor pattern, and then firing the stacked plurality of ceramic base members. Next, one or more outer electrodes are formed at a corresponding end of the multilayer body. The electric element 20 preferably includes a material with a low light absorption rate. More specifically, a surface of the electric element 20 includes a ceramic body that is made of a magnetic material with a low light absorption rate with respect to a $CO_2$ laser beam (for example, at a wavelength of about 10.6 μm), and one or more outer electrodes that are each made of a metal material, for example, Sn, Ni, or Cu. Accordingly, damage to the electric element 20 from the laser beam during laser marking is able to be significantly reduced or prevented.

The electric element 20 includes a rectangular parallelepiped or substantially rectangular parallelepiped shape and is mounted in or on the main surface 40m of the mounting substrate 40 with solder or the like. The height h2 of the electric element 20, which is the distance from the main surface 40m of the mounting substrate 40 to a top surface 20a of the electric element 20, in a state where the electric element 20 is mounted in or on the mounting substrate 40 is, for example, about 0.5 mm. Preferably, for example, the height h2 of the electric element 20 is selected from values within a range of about 0.3 mm or more to about 0.8 mm or less.

In the present preferred embodiment, the height h1 of the elastic wave element 10 is less than the height h2 of the electric element 20. Due to the height h1 of the elastic wave element 10 being relatively small, a structure in which the elastic wave element 10 is covered by the sealing member 30 with a relatively large thickness is able to be provided. Thus, damage sustained by the elastic wave element 10, for example, during laser marking on the top surface 30a of the circuit module 1 is able to be significantly reduced or prevented.

The sealing member 30 includes a resin portion 31, which is an insulator, and a shield portion 32 that is electrically conductive. The shield portion 32 is located outside of the resin portion 31.

The resin portion 31 is injected into a region between the elastic wave element 10 and the electric element 20. Accordingly, the region is filled with the resin portion 31, and the resin portion 31 is also provided in or on the main surface 40m of the mounting substrate 40 to cover the elastic wave element 10 and the electric element 20. The resin portion 31 includes a thermosetting resin material, for example, an epoxy resin, as a main component and a filler dispersed throughout the resin material. The filler dispersed throughout the resin material is, for example, a ceramic filler. Preferably, for example, a filler with a thermal conductivity higher than a thermal conductivity of the resin material, or higher than a thermal conductivity of a main component of the resin material, is included as the filler dispersed throughout the resin material. The diameter of the filler is less than a thickness t2 of the resin portion 31 in a region in which the resin portion 31 covers the electric element 20, that is, the distance between the top surface 20a of the electric element 20 and a top surface 31a of the resin portion 31.

The thickness of the shield portion 32 is, for example, about 0.01 mm. The shield portion 32 is connected to a ground electrode, which is provided in or on the mounting substrate 40. As a material of the shield portion 32, for example, a resin material with an electrically conductive component may be included. For example, the electrically conductive component may be a metal filler, for example, an Ag filler, a Cu filler, or a Ni filler, and the resin material may be, for example, an epoxy resin, a phenolic resin, a urethane resin, a silicon resin, a polyester resin, an acrylic resin, a polyimide resin, or the like.

A thickness t1 of the resin portion 31 in a region in which the resin portion 31 covers the elastic wave element 10, that is the distance between the top surface 10a of the elastic wave element 10 and the top surface 31a of the resin portion 31, is, for example, about 0.32 mm. Preferably, for example, the thickness t1 of the resin portion 31 is selected from values within a range of about 0.08 mm or more to about 0.8 mm or less. In the present preferred embodiment, by setting the thickness t1 of the resin portion 31 to about 0.08 mm or more, damage sustained by the elastic wave element 10 during laser marking on the top surface 30a of the circuit module 1 is able to be significantly reduced or prevented. More preferably, for example, the thickness t1 of the resin portion 31 is selected from values within a range of about 0.15 mm or more to about 0.8 mm or less. By setting the thickness t1 of the resin portion 31 to about 0.15 mm or more, for example, damage sustained by the elastic wave element 10 during laser marking on the top surface 30a of the circuit module 1 is able to be further significantly reduced or prevented.

The thickness t2 of the resin portion 31 in the region in which the resin portion 31 covers the electric element 20 is, for example, about 0.14 mm. Preferably, for example, the thickness t2 of the resin portion 31 is selected from values within a range of about 0.03 mm or more to about 0.14 mm or less. In the present preferred embodiment, by setting the thickness t2 of the resin portion 31 to about 0.14 mm or less, heat generated within the circuit module 1 is able to be efficiently dissipated through the portion of the resin portion 31 including a small thickness, that is, the resin portion 31 in the region in which the resin portion 31 covers the electric element 20.

More specifically, when a voltage is applied to the elastic wave element 10, heat is generated due to vibration of the elastic wave element 10. Although some of the generated heat is dissipated through the resin portion 31 in a region in which the resin portion 31 is in contact with the elastic wave element 10, a large portion of the heat is transferred to the electric element 20 via the solder bumps 16 and the conductor wiring 41, each of which has a relatively high thermal conductivity. The heat transferred to the electric element 20 is dissipated through the portion of the resin portion 31 that is in contact with the top surface 20a of the electric element 20.

As described above, in the present preferred embodiment, since the thickness t2 of the resin portion 31 in the region in which the resin portion 31 covers the electric element 20 is about 0.14 mm or less, for example, the heat transferred to the electric element 20 is able to be efficiently dissipated through the portion of the resin portion 31 including a small thickness (the resin portion 31 in the region in which the resin portion 31 covers the electric element 20). Therefore, an increase in the temperature of the elastic wave element 10 is able to be significantly reduced or prevented, and the electric power handling capability of the circuit module 1 is able to be significantly improved.

Although the thickness t2 of the resin portion 31 is about 0.14 mm or less, for example, damage to the electric element 20 from the laser beam is able to be significantly reduced or prevented, and thus, the influence of the laser beam on the electrical characteristics of the electric element 20 is negligible.

The configuration of the elastic wave element 10, which is included in the circuit module 1, is described below.

Figure 4:
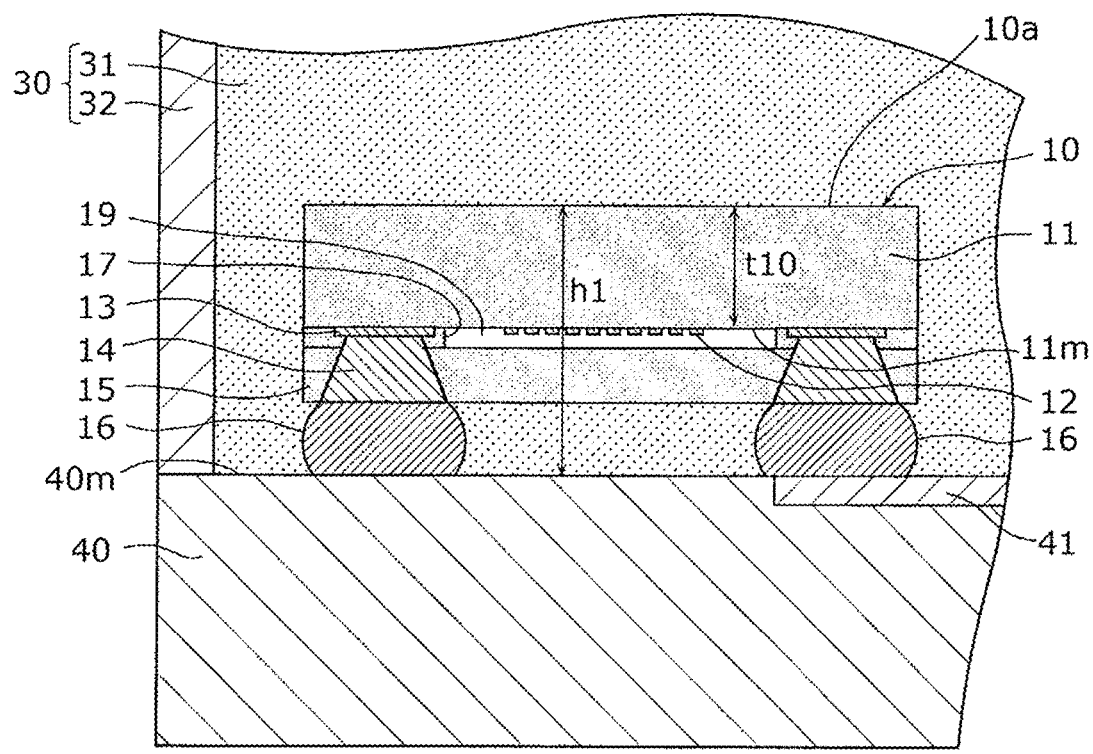
FIG. 4 a cross-sectional view of an elastic wave element included in the circuit module shown in FIG. 2.

FIG. 4 a cross-sectional view of the elastic wave element 10 included in the circuit module 1.

The elastic wave element 10 includes the piezoelectric substrate 11, an interdigital transducer (IDT) electrode 12, a wiring electrode 13, a cover layer 15, a columnar electrode 14, the solder bumps 16, and a support layer 17. A space 19 is provided in the elastic wave element 10 and is defined by the piezoelectric substrate 11, the support layer 17, which is vertically or substantially vertically provided on the periphery of the piezoelectric substrate 11, and the cover layer 15, which is disposed on the support layer 17.

The piezoelectric substrate 11 is a piezoelectric body defining a substrate of the elastic wave element 10 and is formed of, for example, a piezoelectric single crystal containing lithium tantalate ($LiTaO_3$), lithium niobate ($LiNbO_3$), quartz crystal, or the like, or a piezoelectric ceramic.

A thickness t10 of the piezoelectric substrate 11 is, for example, about 0.1 mm. Preferably, for example, the thickness t10 of the piezoelectric substrate 11 is selected from values within a range of about 0.05 mm or more to about 0.11 mm or less.

The IDT electrode 12 is a comb-shaped or substantially comb-shaped electrode that excites a surface acoustic wave and is provided in or on a main surface of the piezoelectric substrate 11. The IDT electrode 12 is preferably made of a metal, for example, Ti, Al, Cu, Au, Pt, Ag, Pd, or Ni, or an alloy, or is preferably made of a multilayer body including at least one of the above-mentioned metals or an alloy. A silicon oxide film or the like may be provided, for example, between the piezoelectric substrate 11 and the IDT electrode 12.

The wiring electrode 13 is an electrode that is included in a wiring path enabling communication between the IDT electrode 12 and an exterior of the elastic wave element 10. The wiring electrode 13 is made of, for example, a material similar to that of the IDT electrode 12.

The support layer 17 is a layer with a height greater than that of the IDT electrode 12 and vertically or substantially vertically surrounds the periphery of a region of the main surface of the piezoelectric substrate 11 in which the IDT electrode 12 is provided. The support layer 17 is made of, for example, a material containing at least one of a polyimide, an epoxy resin, benzocyclobutene (BCB), polybenzoxazole (PBC)), a metal, and silicon oxide.

The cover layer 15 is disposed on the support layer 17 and is a layer that covers the IDT electrode 12 with the space 19 interposed therebetween. The cover layer 15 is made of, for example, a material containing at least one of a polyimide, an epoxy resin, BCB, PBO, a metal, and silicon oxide.

The columnar electrode 14 is a columnar or substantially columnar electrode that is included in a wiring path enabling communication between the wiring electrode 13 and an exterior of the elastic wave element 10. The columnar electrode 14 extends through the support layer 17 and the cover layer 15. The columnar electrode 14 is made of, for example, a material similar to that of the IDT electrode 12.

The elastic wave element 10 including the above-described structure generates heat by vibrating due to a voltage being applied thereto. The heat is transferred to the solder bumps 16 sequentially through the IDT electrode 12, the wiring electrode 13, and the columnar electrode 14, further transferred from the solder bumps 16 sequentially through the conductor wiring 41, the electric element 20, and the resin portion 31, and is dissipated.

In the present preferred embodiment, the height of the elastic wave element 10 is reduced by setting the thickness t1 of the piezoelectric substrate 11 preferably to about 0.11 mm or less, for example. Accordingly, the height of the circuit module 1 is able to be reduced.

The circuit module 1 according to the present preferred embodiment includes a structure in which heat generated by the elastic wave element 10 is transferred to the electric element 20 through the IDT electrode 12, the wiring electrode 13, the columnar electrode 14, the solder bumps 16, and the conductor wiring 41 and is dissipated from the electric element 20 through the resin portion 31. Thus, even in a case where a heat transfer path of the piezoelectric substrate 11 becomes narrower due to setting the thickness t10 of the piezoelectric substrate 11 to be relatively small, since the circuit module 1 includes the above-described heat-dissipation structure, an increase in the temperature of the elastic wave element 10 is able to be significantly reduced or prevented, and the electric power handling capability of the circuit module 1 is able to be significantly improved.

The circuit module 1 according to the present preferred embodiment includes the mounting substrate 40, which includes the conductor wiring 41, the elastic wave element 10, which is provided in or on the main surface 40m of the mounting substrate 40, the electric element 20, which is provided in or on the main surface 40m of the mounting substrate 40 and which is different from the elastic wave element 10, and the resin portion 31, which is provided in or on the main surface 40m of the mounting substrate 40 to cover the elastic wave element 10 and the electric element 20 and which is an insulator. The elastic wave element 10 and the electric element 20 are connected to each other by the conductor wiring 41. The height h1 of the elastic wave element 10 preferably is about 0.28 mm or less, for example, which is less than the height h2 of the electric element 20, and the thickness t1 of the resin portion in the region in which the resin portion 31 covers the elastic wave element 10 is greater than the thickness t2 of the resin portion 31 in the region in which the resin portion 31 covers the electric element 20.

As described above, the height of the elastic wave element 10 is reduced by setting the height of the elastic wave element 10 preferably to about 0.28 mm or less, for example. Accordingly, a reduction in the height of the circuit module 1 is able to be provided.

In addition, by increasing the thickness t1 of the resin portion 31 in the region in which the resin portion 31 covers the elastic wave element 10, damage sustained by the elastic wave element 10, for example, during laser marking on the top surface 30a of the circuit module 1 is able to be significantly reduced or prevented.

Furthermore, by reducing the thickness t2 of the resin portion 31 in the region in which the resin portion 31 covers the electric element 20, heat generated within the circuit module 1 is able to be efficiently dissipated through the portion of the resin portion 31 including a small thickness, that is, the resin portion 31 in the region in which the resin portion 31 covers the electric element 20. For example, when a voltage is applied to the elastic wave element 10, heat is generated due to vibration of the elastic wave element 10, and according to the above-described structure, the generated heat is able to be transferred to the electric element 20 through the conductor wiring 41 and dissipated from the electric element 20 through the portion of the resin portion 31 with a small thickness. Accordingly, an increase in the temperature of the elastic wave element 10 is able to be significantly reduced or prevented, and the electric power handling capability of the circuit module 1 is able to be significantly improved.

Although the circuit module 1 according to the present invention has been described above on the basis of preferred embodiments and modifications thereof, the present invention is not limited to the preferred embodiment and modifications. Other preferred embodiments obtained by making various modifications including modifications or combinations of the components in the preferred embodiments and modifications are also included in the scope of the present invention as long as they are within the gist of the present invention.

For example, the elastic wave element 10 is not limited to a surface acoustic wave element and may be a boundary acoustic wave element.

The electric element 20 is not limited to a multilayer ceramic inductor and may be, for example, a multilayer ceramic capacitor.

In the present preferred embodiment, although the shield portion 32 is connected to the ground electrode, the present invention is not limited to this configuration, and the shield portion 32 does not need to be grounded, for example.

The type of laser that applies the laser marking on the circuit module 1 is not limited to a $CO_2$ laser and may be, for example, a YAG laser.

Preferred embodiments of the present invention are able to be applied to, for example, a circuit module included in a communication module of a mobile communication terminal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a mounting substrate including a conductor wiring;
an elastic wave element provided in or on a main surface of the mounting substrate;
an electric element provided in or on the main surface of the mounting substrate, the electric element being different from the elastic wave element; and
a resin portion provided in or on the main surface of the mounting substrate to cover the elastic wave element and the electric element; wherein
the resin portion is an insulator;
the elastic wave element and the electric element are directly connected to each other by the conductor wiring and are arranged adjacent to one another;
a height of the elastic wave element is less than a height of the electric element;
a thickness of the resin portion in a region in which the resin portion covers the elastic wave element is greater than a thickness of the resin portion in a region in which the resin portion covers the electric element;
the elastic wave element includes a piezoelectric substrate and an interdigital transducer (IDT) electrode provided in or on a main surface of the piezoelectric substrate; and
the main surface of the piezoelectric substrate and the main surface of the mounting substrate face each other.

2. The circuit module according to claim 1, wherein the elastic wave element further includes:
a support portion vertically or substantially vertically surrounding a periphery of a region of the main surface of the piezoelectric substrate in which the IDT electrode is provided; and
a cover portion disposed on the support portion, the cover portion covering the IDT electrode with a space being defined between the IDT electrode and the cover portion; and
the elastic wave element is connected to the conductor wiring of the mounting substrate by a solder bump between the conductor wiring of the mounting substrate and the elastic wave element.

3. The circuit module according to claim 2, wherein each of the cover portion and the support portion includes at least one of a polyimide, an epoxy resin, benzocyclobutene (BCB), polybenzoxazole (PBO), a metal, and silicon oxide.

4. The circuit module according to claim 1, wherein the thickness of the resin portion in the region in which the resin portion covers the electric element is about 0.14 mm or less.

5. The circuit module according to claim 1, wherein the electric element includes a material that is less likely to absorb a laser beam than the elastic wave element.

6. The circuit module according to claim 1, wherein the electric element is a chip ceramic electronic component.

7. The circuit module according to claim 2, wherein the cover portion and the support portion are made of a same material.

8. The circuit module according to claim 1, wherein
the resin portion includes a resin material and a filler dispersed throughout the resin material; and
a thermal conductivity of the filler is higher than a thermal conductivity of the resin material.

9. A circuit module comprising:
a mounting substrate including a conductor wiring;
an elastic wave element provided in or on a main surface of the mounting substrate;
an electric element provided in or on the main surface of the mounting substrate, the electric element being different from the elastic wave element;
a resin portion provided in or on the main surface of the mounting substrate to cover the elastic wave element and the electric element; and
a shield portion that is electrically conductive; wherein
the resin portion is an insulator;
the elastic wave element and the electric element are connected to each other by the conductor wiring and are arranged adjacent to one another;
a height of the elastic wave element is less than a height of the electric element;
a thickness of the resin portion in a region in which the resin portion covers the elastic wave element is greater than a thickness of the resin portion in a region in which the resin portion covers the electric element; and
the shield portion covers at least an outer top surface of the resin portion.

10. The circuit module according to claim 4, wherein the thickness of the resin portion in the region in which the resin portion covers the elastic wave element is between about 0.08 mm and about 0.8 mm.

11. The circuit module according to claim 1, wherein
the mounting substrate includes a ceramic substrate or a glass epoxy substrate; and
the conductor wiring includes a metal foil.

12. The circuit module according to claim 2, wherein the elastic wave element and the electric element are electrically and thermally connected to each other by the conductor wiring and the solder bump.

13. The circuit module according to claim 1, wherein the elastic wave element is an acoustic wave device.

14. The circuit module according to claim 1, wherein the electric element is a multilayer inductor.

15. The circuit module according to claim 9, wherein the shield portion includes a resin material and an electrically conductive component.

16. The circuit module according to claim 1, wherein the elastic wave element further includes a wiring electrode that enables communication between the IDT electrode and an exterior of the elastic wave element.

17. The circuit module according to claim 16, wherein the elastic wave element further includes a columnar electrode that is columnar or substantially columnar and enables communication between the wiring electrode and the exterior of the elastic wave element.

18. The circuit module according to claim 9, wherein the thickness of the resin portion in the region in which the resin portion covers the electric element is about 0.14 mm or less.

19. The circuit module according to claim 9, wherein the electric element includes a material that is less likely to absorb a laser beam than the elastic wave element.

20. The circuit module according to claim 9, wherein the electric element is a chip ceramic electronic component.

21. The circuit module according to claim 9, wherein
the resin portion includes a resin material and a filler dispersed throughout the resin material; and a thermal conductivity of the filler is higher than a thermal conductivity of the resin material.

22. The circuit module according to claim 18, wherein the thickness of the resin portion in the region in which the resin portion covers the elastic wave element is between about 0.08 mm and about 0.8 mm.

23. The circuit module according to claim 9, wherein
the mounting substrate includes a ceramic substrate or a glass epoxy substrate; and
the conductor wiring includes a metal foil.

24. The circuit module according to claim 9, wherein the elastic wave element is an acoustic wave device.

25. The circuit module according to claim 9, wherein the electric element is a multilayer inductor.

26. The circuit module according to claim 2, wherein the cover portion is made of a material that is different from a material of which the support portion is made.

* * * * *